United States Patent
Park et al.

(10) Patent No.: US 6,771,328 B2
(45) Date of Patent: Aug. 3, 2004

(54) ACTIVE MATRIX ORGANIC ELECTROLUMINESCENT DEVICE SIMPLIFYING A FABRICATING PROCESS AND A FABRICATING METHOD THEREOF

(75) Inventors: Jae-Yong Park, Gyeonggi-Do (KR); Juhn-Suk Yoo, Seoul (KR); Sung-Ki Kim, Seoul (KR); Yong-In Park, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 216 days.

(21) Appl. No.: 10/179,386

(22) Filed: Jun. 26, 2002

(65) Prior Publication Data

US 2004/0012028 A1 Jan. 22, 2004

(30) Foreign Application Priority Data

Jul. 25, 2001 (KR) ......................................... 2001-44928
Oct. 9, 2001 (KR) ......................................... 2001-61982

(51) Int. Cl.[7] .................. H01L 35/24; G02F 1/136
(52) U.S. Cl. ........................... 349/42; 349/43; 349/138; 257/59
(58) Field of Search ........................... 349/42, 43, 138; 257/59

(56) References Cited

U.S. PATENT DOCUMENTS 5,912,473 A * 6/1999 Wakita et al. ................. 257/40
6,580,475 B2 * 6/2003 Yamazaki et al. ............ 349/43

* cited by examiner

Primary Examiner—David Vu
(74) Attorney, Agent, or Firm—McKenna Long & Aldridge LLP

(57) ABSTRACT

In a multi-layered structure of the organic EL diode, a gate insulating layer is formed on a buffer layer. A first insulating layer is formed on the gate insulating layer. An anode is formed on the first insulating layer. Second and third insulating layers commonly having an open portion are sequentially formed on the anode. An organic EL layer and a cathode are connected to the anode through the open portion. The anode is connected to a drain electrode of a TFT through an anode contact hole and the TFT is insulated from the organic EL layer by the third insulating layer.

44 Claims, 13 Drawing Sheets

ACTIVE MATRIX ORGANIC ELECTROLUMINESCENT DEVICE SIMPLIFYING A FABRICATING PROCESS AND A FABRICATING METHOD THEREOF

This application claims the benefit of Korean Patent Application Nos. 2001-44928 filed on Jul. 25, 2001, and 2001-61982 filed on Oct. 9, 2001, which are hereby incorporated by reference in their entirety as if fully set forth herein.

BACKGROUND OF THE INVENTION

1. Field of the Invention

The present invention relates to organic electroluminescent devices, and more particularly, to an active matrix electroluminescent device.

2. Discussion of the Related Art

Flat panel display (FPD) devices having small size, lightweight, and low power consumption may have been a subject of recent research in the coming of the information age. FPD devices may be classified into two types depending on whether the device emits or receives light. One type is a light-emitting type display device that emits light to display images, and the other type is a light-receiving type display device that uses an external light source to display images. Plasma display panels (PDPs), field emission display (FED) devices, and electroluminescent (EL) devices are examples of the light-emitting type display devices. Liquid crystal display (LCD) devices are examples of the light-receiving type display device.

Among many kinds of FPD devices, LCD devices are widely used because of their excellent characteristics of resolution, color display and display quality. However, since the LCD device is the light-receiving type display device, it has some disadvantages such as poor contrast ratio, narrow viewing angle, and difficulty in enlarging its size. Therefore, new types of FPD need to be researched and developed to overcome the aforementioned disadvantages.

Recently, organic EL devices have been of the most interest in research and development because they are light-emitting type displays having a wide viewing angle and a good contrast ratio as compared with the LCD devices. Since a backlight is not necessary, the organic EL device can be light weight and thin. Furthermore, the organic EL device has low power consumption. When driving the organic EL device, a low voltage of direct current (DC) can be used, and a rapid response speed can be obtained. As widely known, since the organic EL device is totally solid phase, unlike the LCD device, it is sufficiently strong to withstand external impacts and has a greater operational temperature range. Additionally, the organic EL device can be manufactured at a low cost; particularly since a manufacturing process of the EL device is very simple in contrast with a LCD device or a PDP, only deposition and encapsulation apparatuses are necessary for manufacturing the organic EL device.

As an operating method for the organic EL device, a passive matrix operating method not using additional thin film transistors (TFTs) is conventionally utilized. However, since the passive matrix organic EL device has many limitations in resolution, power consumption and life time, an active matrix organic EL device has been researched and developed as a next generation display device requiring high resolution and large display area. In the passive matrix organic EL device, scanning lines and signal lines perpendicularly cross each other to be arranged in a matrix shape. In the active matrix organic EL device, a TFT is disposed at each pixel as a switch turning on/off a first electrode connected to the TFT and a second electrode facing the first electrode is commonly used.

A scanning voltage is sequentially applied to the scanning lines to operate each pixel in the passive organic EL device. To obtain the required average brightness, an instantaneous brightness of each pixel during the selection period should reach a value resulting from multiplying the average brightness by the number of scanning lines. Accordingly, as the number of the scanning lines increases, applied voltage and current increases. Therefore, the passive matrix organic EL device is not adequate to a display of high resolution and large area because the device is easily deteriorated and the power consumption is high.

However, in the active matrix organic EL device, a voltage applied to the pixel is stored in a storage capacitor, thereby maintaining the voltage and driving the device until a voltage of next frame is applied, regardless of the number of the scanning lines. As a result, since an equivalent brightness is obtained with a low applied current, an active matrix organic EL device of low power consumption, high resolution and large area may be made.

FIG. 1 is an equivalent circuit diagram showing a basic pixel structure of a conventional active matrix organic EL device.

In FIG. 1, a scanning line 10 is arranged in a first direction, and signal line 20 and a power line 30 are arranged in a second direction perpendicular to the first direction, thereby defining a pixel region. The signal line 20 and the power line 30 are spaced apart form each other. A switching TFT "$T_S$," an addressing element, is connected to the scanning line 10 and the signal line 20, and a storage capacitor "$C_{ST}$" is connected to the switching TFT "$T_S$" and the power line 30. A driving TFT "$T_D$," a current source element, is connected to the storage capacitor "$C_{ST}$" and the power line 30, and an organic EL diode "$D_{EL}$" is connected to the driving TFT "$T_D$."

The organic EL diode "$D_{EL}$" has a double-layer structure of organic thin films between an anode and a cathode. When a forward current is applied to the organic EL diode "$D_{EL}$," an electron and a hole are recombined to generate a electron-hole pair through the P(positive)-N(negative) junction between the anode providing the hole and the cathode providing the electron. The electron-hole pair has a lower energy than the separated electron and hole. Therefore, an energy difference occurs between the recombination and the separation of electron-hole pair, and light is emitted due to the energy difference. The switching TFT "$T_S$" adjusts the forward current through the driving TFT "$T_D$" and stores charges in the storage capacitor "$C_{ST}$."

A principle of driving the active matrix organic EL device will be illustrated.

When a voltage is applied to a selected scanning line 10 according to a selection signal, a gate electrode of the switching TFT "$T_S$" is turned on and a data signal of the signal line 20 passes the switching TFT "$T_S$." The data signal is applied to the driving TFT "$T_D$" and the storage capacitor "$C_{ST}$." Accordingly, a gate electrode of the driving TFT "$T_D$" is turned on and a current of the power line 30 is supplied to organic EL diode "$D_{EL}$" through the driving TFT "$T_D$." As a result, light is emitted. An open degree of the gate electrode of the driving TFT "$T_D$" depends on the data signal so that a gray level can be obtained by adjusting a current flowing through the driving TFT "$T_D$." Moreover, since the data signal stored in the storage capacitor "$C_{ST}$" is applied to the driving TFT "$T_D$" during a non-selected period, light is continuously emitted at the organic EL diode "$D_{EL}$" until a voltage of the next frame is applied to the scanning line.

Accordingly, the active matrix organic EL device uses a lower voltage and a lower instantaneous current in contrast with the passive matrix organic EL device. Since the organic EL diode is continuously driven during one frame regardless of the number of the scanning lines, the active matrix organic EL device is adequate for low power consumption, high resolution, large area.

In the active matrix organic EL device, a current flows through a TFT. Therefore, a poly silicon (p-Si) TFT of high field effect mobility is preferable to a conventional amorphous silicon (a-Si) TFT of a low field effect mobility. Since the p-Si TFT has high field effect mobility, a driving circuit may be formed on a substrate with the p-Si TFT so that a cost for driving integrated circuit (IC) is reduced and fabrication is simplified. A low temperature crystallization method through a laser annealing of a-Si is widely used as a fabricating method of p-Si.

FIG. 2 is a schematic cross-sectional view of a conventional active matrix organic EL device. FIG. 2 shows an organic EL diode, a storage capacitor and a driving TFT. Moreover, a bottom emission type, in which light is emitted through an anode of a lower electrode, is adopted.

In FIG. 2, a TFT "T" having a semiconductor layer 32, a gate electrode 38, source and drain electrodes 50 and 52 is formed on a substrate 10. The TFT "T" is connected to a storage capacitor "$C_{ST}$" and an organic EL diode "$D_{EL}$." The storage capacitor "$C_{ST}$" includes a power electrode 42 and a storage electrode 34 facing each other. A first insulating layer 40 is interposed between the power electrode 42 and the storage electrode 34. The organic EL diode "$D_{EL}$" includes an anode 58 and a cathode 66 facing each other, and an organic EL layer 64 is interposed therebetween. The source electrode 50 of the TFT "T" is connected to the power electrode 42 and the drain electrode 52 of the TFT "T" is connected to the anode 58 of the organic EL diode "$D_{EL}$."

In the bottom emission type, the anode 58 is made of transparent material to transmit light emitted from the organic EL layer 64 and a cathode 66 is made of metal having low work function to inject electrons into the organic EL layer 64 with ease. In the top emission type, since light of the organic EL layer is emitted upward through the cathode, the cathode is made of transparent material.

Regarding multi-layered structure of insulating layers, a buffer layer 30 between the substrate 10 and the semiconductor layer 32, a first insulating layer 40 for the storage capacitor "$C_{ST}$," a second insulating layer 44 between the source electrode 50 and the power electrode 42, a third insulating layer 54 between the anode 58 and the drain electrode 52 and a passivation layer 60 between the organic EL layer 64 and the anode 58 are formed. The first, second and third insulating layers 40, 44 and 54 and the passivation layer 60 have contact holes for electric connection.

FIGS. 3A to 3I are cross-sectional views showing fabricating process of an active matrix organic EL device of FIG. 2. Patterns are formed through a photolithography process of photoresist (PR) coating, aligning, exposing and developing steps using a mask.

In FIG. 3A, after a buffer layer 30 is formed on an entire surface of a substrate 10, an active layer 32a and a storage electrode 34 of poly crystalline silicon are formed on the buffer layer 30 through a first mask process.

In FIG. 3B, after forming a gate insulating layer 36 on the entire surface of the substrate 10, a gate electrode 38 of metal is formed on the gate insulating layer 36 over the active layer 32a through a second mask process.

In FIG. 3C, after forming a first insulating layer 40 on the entire surface of the substrate 10, a power electrode 42 of metal is formed on the first insulating layer 40 to cover the storage electrode 34 through a third mask process.

In FIG. 3D, a second insulating layer 44 having a source contact hole, a drain contact hole and a storage contact hole 46a, 46b and 48 resulting from a fourth mask process is formed on the power electrode 42. The source and drain contact holes 46a and 46b expose right and left side portions of the active layer 32a, respectively, and the storage contact hole 48 exposes the power electrode 42. The right and left side portions of the active layer 32a compose source and drain regions "Ia" and "Ib," respectively. Next, the semiconductor layer 32 having an active layer 32a and an ohmic contact layer 32b is completed through impurity doping both sides of the active layer 32a with ions.

In FIG. 3E, a drain electrode 52 and a source electrode 50 spaced apart from each other are formed on the second insulating layer 44 through a fifth mask process. The source electrode 50 is connected to the ohmic contact layer 32b of the source region "Ia" through the source contact hole 46a (of FIG. 3D), and the drain electrode 52 is connected to the ohmic contact layer 32c of the drain region "Ib" through the drain contact hole 46b (of FIG. 3D) and connected to the power electrode 42 through the storage contact hole 48 (of FIG. 3D). Through the previous process, a TFT "T" having the semiconductor layer 32, the gate electrode 38, source and drain electrodes 50 and 52 is completed. Moreover, a region corresponding to the power electrode 42 and the storage electrode 34 composes a storage capacitor "$C_{ST}$." The storage electrode 34 is connected to the gate electrode 38 (not shown) and the power electrode 42 is unified with the power line parallel to the signal line.

In FIG. 3F, a third insulating layer 54 having a drain contact hole 56 resulting from a sixth mask process is formed on the source and drain electrodes 50 and 52.

In FIG. 3G, an anode 58 of transparent conductive material, which is connected to the drain electrode 52 through the drain contact hole 56 (of FIG. 3F), is formed on the third insulating layer 54 through a seventh mask process.

In FIG. 3H, a passivation layer 60 having a open portion 62 exposing the anode 58 is formed on the entire surface of the substrate 10 through a eighth mask process. The passivation layer 60 protects the TFT "T" from moisture or impurities.

In FIG. 3I, an organic EL layer 64 and a cathode 66 composing an organic EL diode "$D_{EL}$" with the anode 58 through the open portion 62 (of FIG. 3H) are formed on the passivation layer 60.

At least eight mask processes are necessary for a conventional active matrix organic EL device. Since the mask process includes deposition of high temperature, consumption of the PR and a process of physical or chemical treatment such as an etching, production yield decreases according to an increase of the number of the masks.

SUMMARY OF THE INVENTION

Accordingly, the present invention is directed to a liquid crystal display device that substantially obviates one or more of problems due to limitations and disadvantages of the related art.

An advantage of the present invention is to provide an active matrix organic EL device of low fabrication cost and high production yield by reducing the number of mask processes.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, an active matrix organic electroluminescent device includes: a substrate; a semiconductor layer and a storage electrode on the substrate; a gate insulating layer on the semiconductor layer and the storage electrode, the gate insulating layer having source and drain contact holes; a gate electrode on the gate insulating layer over the semiconductor layer; a first insulating layer on the gate electrode, the first insulating layer covering the storage electrode and having the source and drain contact holes in common with the gate insulating layer; a power electrode on the first insulating layer, the power electrode covering the storage electrode; an anode of transparent conductive material on the first insulating layer; a second insulating layer on the anode, the second insulating layer having an open portion, an anode contact hole and a storage contact hole, the second insulating layer having the source and drain contact holes in common with the gate insulating layer and the first insulating layer; source and drain electrodes on the second insulating layer spaced apart from each other, the source electrode being connected to the semiconductor layer through the source contact hole and to the power electrode through the storage contact hole, the drain electrode being connected to the semiconductor through the drain contact hole and to the anode through the anode contact hole; a third insulating layer on the source and drain electrodes, the third insulating layer having the open portion in common with the second insulating layer; an organic electroluminescent layer on the third insulating layer, the organic electroluminescent layer contacting the anode through the open portion; and a cathode of opaque conductive material on the organic electroluminescent layer.

In another aspect of the present invention, a fabricating method of an active matrix organic electroluminescent device includes: forming a semiconductor layer and a storage electrode on a substrate; forming a gate insulating layer on the semiconductor layer and the storage electrode, the gate insulating layer having source and drain contact holes; forming a gate electrode on the gate insulating layer over the semiconductor layer; forming a first insulating layer on the gate electrode, the first insulating layer covering the storage electrode and having the source and drain contact holes in common with the gate insulating layer; forming a power electrode on the first insulating layer, the power electrode covering the storage electrode; forming an anode of transparent conductive material on the first insulating layer; forming a second insulating layer on the anode, the second insulating layer having an open portion, an anode contact hole and a storage contact hole, the second insulating layer having the source and drain contact holes in common with the gate insulating layer and the first insulating layer; forming source and drain electrodes on the second insulating layer spaced apart from each other, the source electrode being connected to the semiconductor layer through the source contact hole and to the power electrode through the storage contact hole, the drain electrode being connected to the semiconductor through the drain contact hole and to the anode through the anode contact hole; forming a third insulating layer on the source and drain electrodes, the third insulating layer having the open portion in common with the second insulating layer; forming an organic electroluminescent layer on the third insulating layer, the organic electroluminescent layer contacting the anode through the open portion; and forming a cathode of opaque conductive material on the organic electroluminescent layer.

In another aspect, an active matrix organic electroluminescent device includes: a substrate; a semiconductor layer on the substrate; a gate insulating layer on the semiconductor layer, the gate insulating layer having source and drain contact holes; a gate electrode and a storage electrode on the gate insulating layer, the gate electrode being over the semiconductor layer, the gate electrode and the storage electrode being simultaneously formed; a first insulating layer on the gate electrode and the storage electrode, the first insulating layer having the source and drain contact holes in common with the gate insulating layer; a power electrode and an anode on the first insulating layer, the power electrode covering the storage electrode, the power electrode and the anode being simultaneously formed; a second insulating layer on the power electrode and the anode, the second insulating layer having an open portion, an anode contact hole and a storage contact hole, the second insulating layer having the source and drain contact holes in common with the gate insulating layer and the first insulating layer; source and drain electrodes on the second insulating layer spaced apart from each other, the source electrode being connected to the semiconductor layer through the source contact hole and to the power electrode through the storage contact hole, the drain electrode being connected to the semiconductor through the drain contact hole and to the anode through the anode contact hole; a third insulating layer on the source and drain electrodes, the third insulating layer having the open portion in common with the second insulating layer; an organic electroluminescent layer on the third insulating layer, the organic electroluminescent layer contacting the anode through the open portion; and a cathode on the organic electroluminescent layer.

In another aspect, a fabricating method of an active matrix organic electroluminescent device includes: forming a semiconductor layer on a substrate through a first mask process; doping ions into the semiconductor layer; forming a gate insulating layer on the semiconductor layer; simultaneously forming a gate electrode and a storage electrode on the gate insulating layer through a second mask process, the gate electrode being over the semiconductor layer; forming a first insulating layer on the gate electrode and the storage electrode; simultaneously forming a power electrode and an anode on the first insulating layer through a third insulating layer, the power electrode covering the storage electrode; forming a second insulating layer on the power electrode and the anode; simultaneously forming an anode contact hole, storage contact hole, source and drain contact holes of the second insulating layer through a four mask process, the anode contact hole exposing the anode, the storage contact hole exposing the power electrode, the source and drain electrodes exposing the semiconductor layer; forming source and drain electrodes spaced apart from each other on the second insulating layer through a fifth mask process, the source electrode being connected to the semiconductor layer through the source contact hole and to the power electrode through the storage contact hole, the drain electrode being connected to the semiconductor through the drain contact hole and to the anode through the anode contact hole; forming a third insulating layer on the source and drain electrodes; forming an open portion of the third insulating layer through a sixth mask process, the open portion exposing the anode; forming an organic electroluminescent layer on the third insulating layer, the organic electroluminescent layer contacting the anode through the open portion; and forming a cathode on the organic electroluminescent layer.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Wherever possible, similar reference numbers will be used throughout the drawings to refer to the same or like parts.

Figure 1:
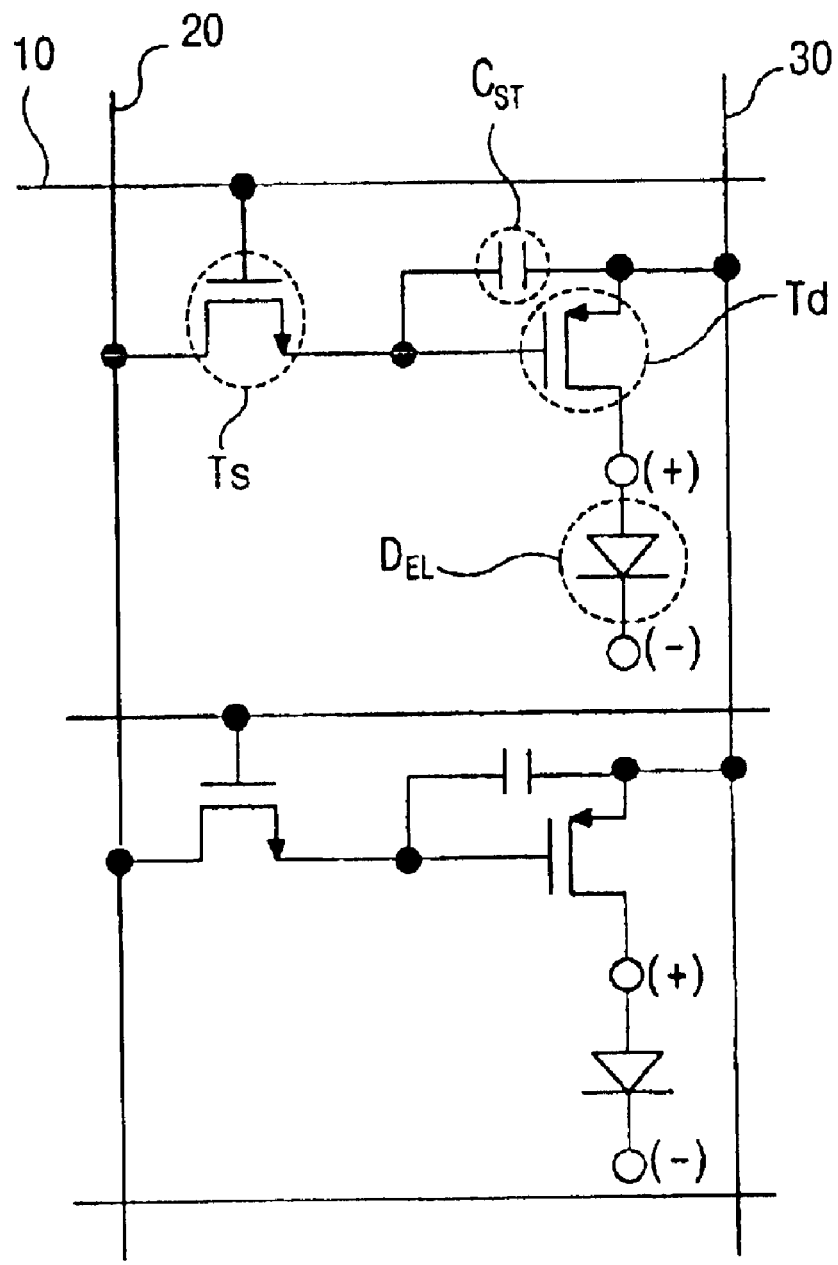
FIG. 1 is an equivalent circuit diagram showing a basic pixel structure of a conventional active matrix organic EL device.
Figure 2:
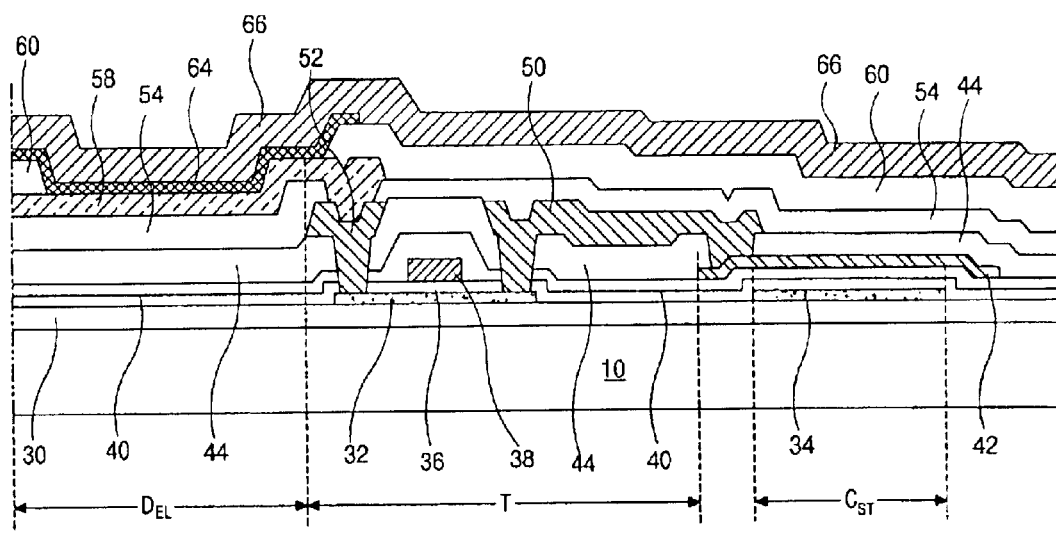
FIG. 2 is a schematic cross-sectional view of a conventional active matrix organic EL device.
Figure 4:
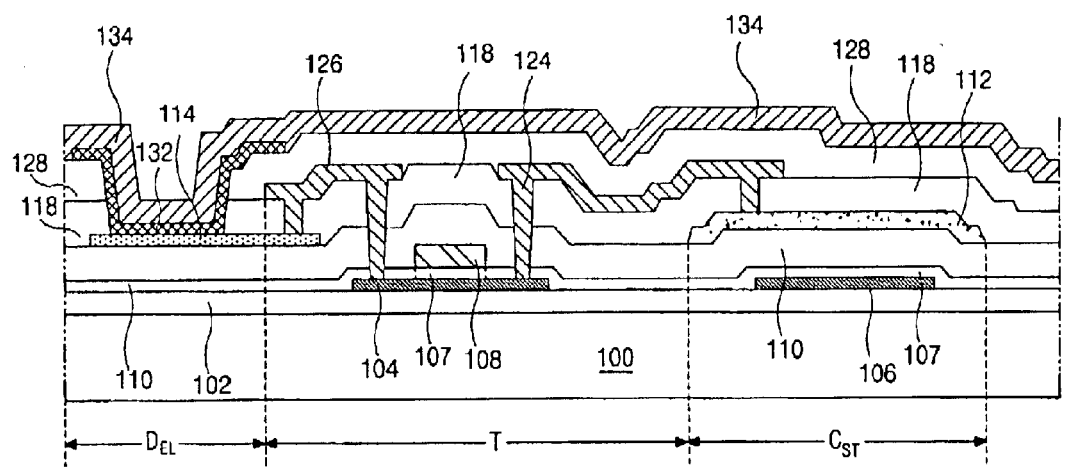
FIG. 4 is a schematic cross-sectional view of an active matrix organic EL device according to an exemplary embodiment of the present invention.

FIG. 4 is a schematic cross-sectional view of an active matrix organic EL device according to an exemplary embodiment of the present invention. Since the active matrix organic EL device uses a p-Si TFT, a top gate type is adopted. Even though a pixel structure of FIG. 1 is applied, other structures using one TFT or four TFTs can be applied. In the structure using one TFT, the TFT is disposed at a crossing of a scanning line and a signal line and an organic EL device is connected to the TFT. In the structure using four TFTs, TFTs for compensation are added to increase a brightness uniformity.

In FIG. 4, a buffer layer 102 is formed on a substrate 100. A semiconductor layer 104 and a storage electrode 106, which are not electrically connected, are formed on the buffer layer 102. A gate insulating layer 107 and a gate electrode 108 are sequentially formed on a center portion of the semiconductor layer 104. Source and drain electrodes 124 and 126 are connected to right and left side portions of the semiconductor layer 104, respectively. A power electrode 112 covering the storage electrode 106 is connected to the source electrode 124. A first insulating layer 110 is interposed between the power electrode 112 and the storage electrode 106 to constitute a storage capacitor "$C_{ST}$". Moreover, an anode 114 of an organic EL diode "$D_{EL}$" is connected to the drain electrode 126. A second insulating layer 118 having an open portion is formed on a TFT "T" and an organic EL layer 132 is connected to the anode 114 through the open portion. A cathode 134 is formed on the organic EL layer 132 as a common electrode.

In a multi-layered structure of the organic EL diode "$D_{EL}$," the gate insulating layer 107 is formed on the buffer layer 102. The first insulating layer 110 is formed on the gate insulating layer 107. The anode 114 is formed on the first insulating layer 110. The second and third insulating layers 118 and 128 commonly having an open portion are sequentially formed on the anode 114. The organic EL layer 132 and the cathode 134 are connected to the anode 114 through the open portion. The anode 114 is connected to the drain electrode 126 of the TFT "T" through an anode contact hole and the TFT "T" is insulated from the organic EL layer 132 by the third insulating layer 128.

Figure 3A:
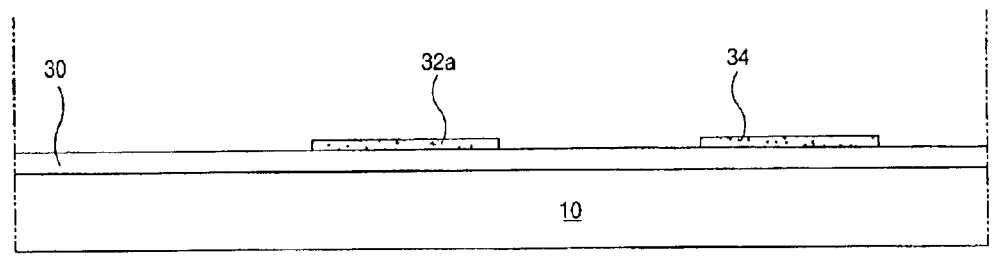
FIGS. 3A to 3I are cross-sectional views showing fabricating process of an active matrix organic EL device of FIG. 2.
Figure 3B:
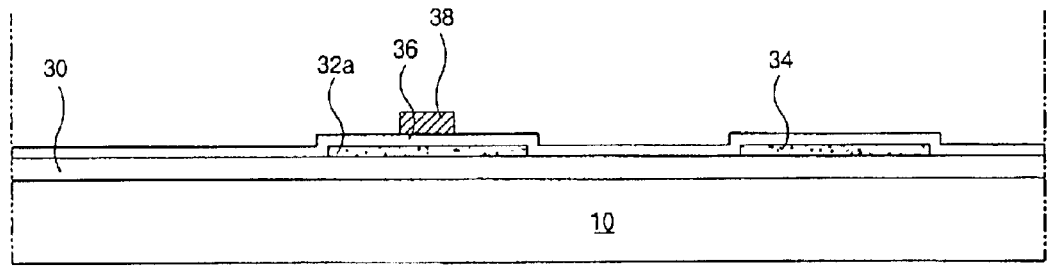
Figure 3C:
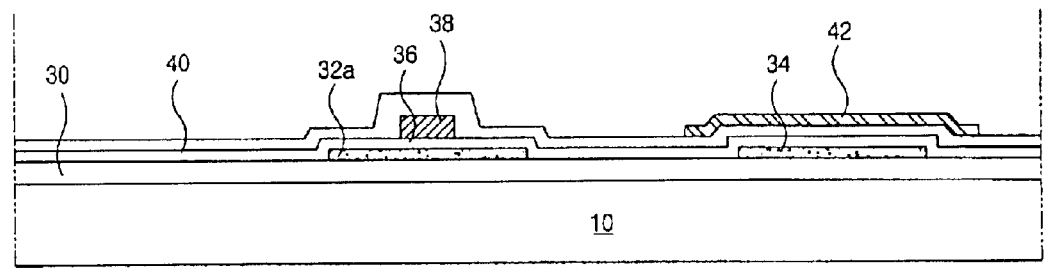
Figure 3D:
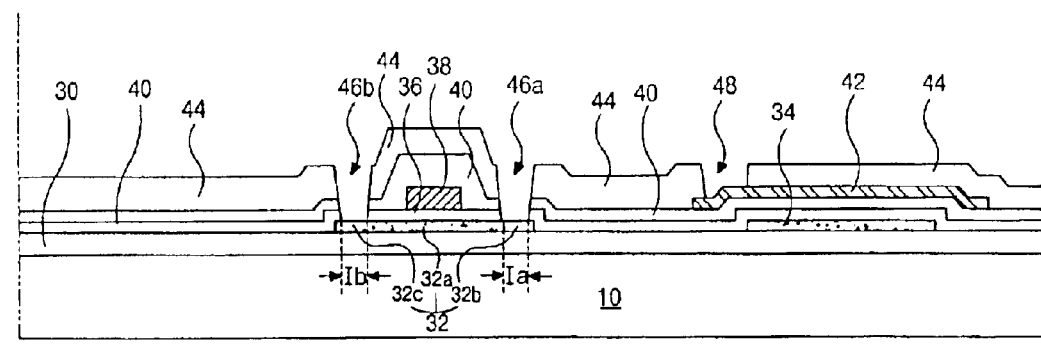
Figure 3E:
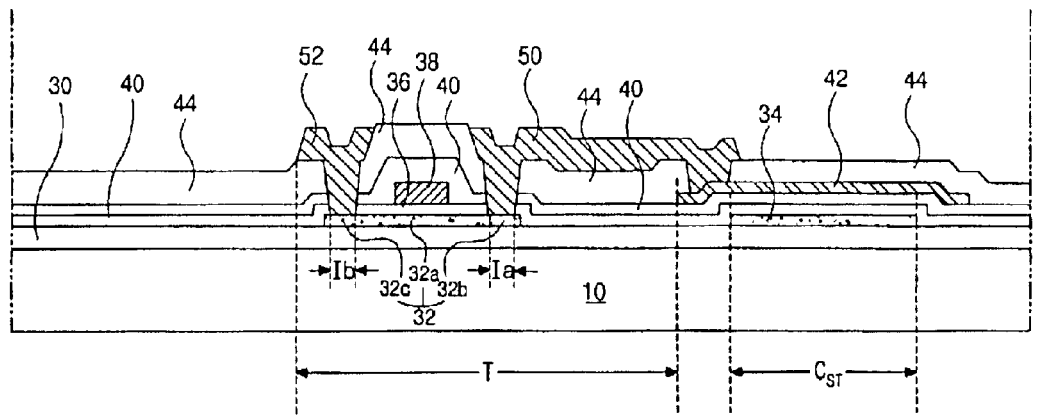
Figure 3F:
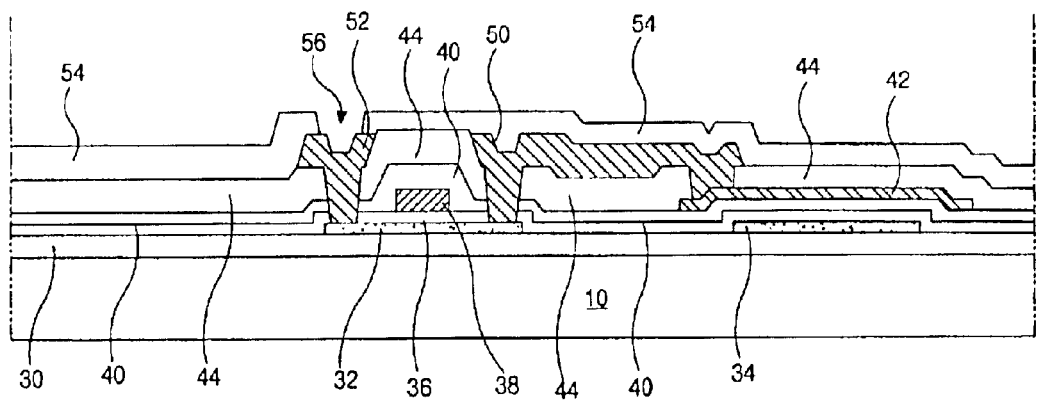
Figure 3G:
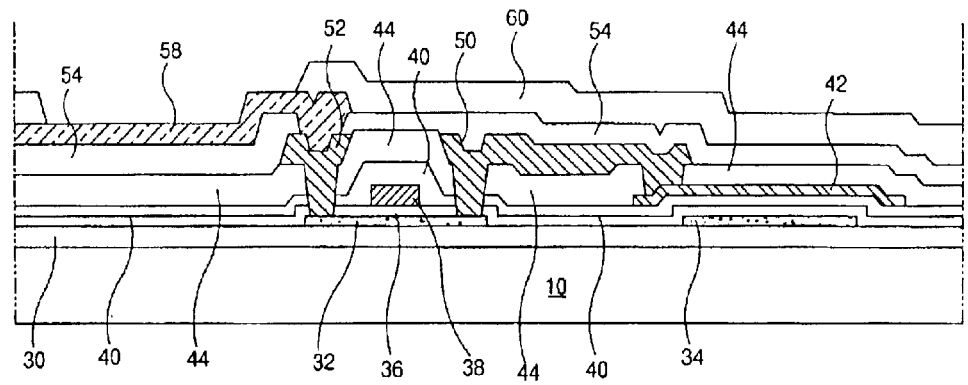
Figure 3H:
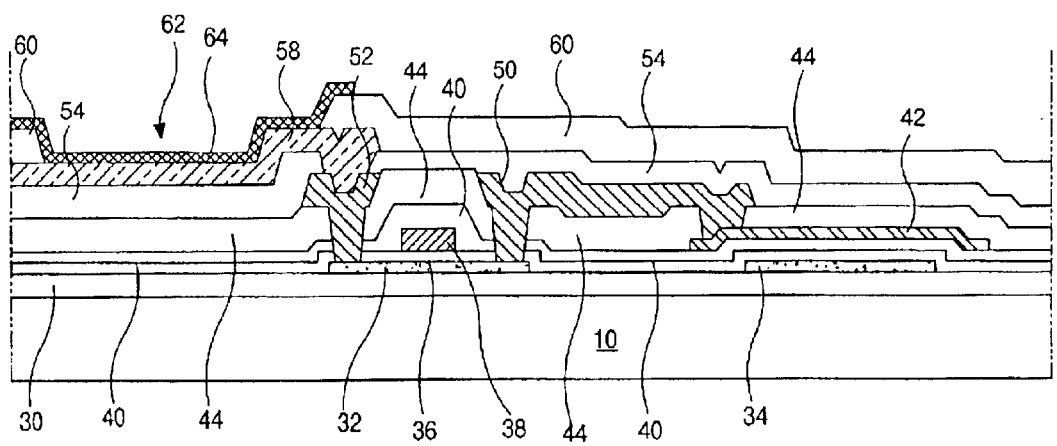
Figure 3I:
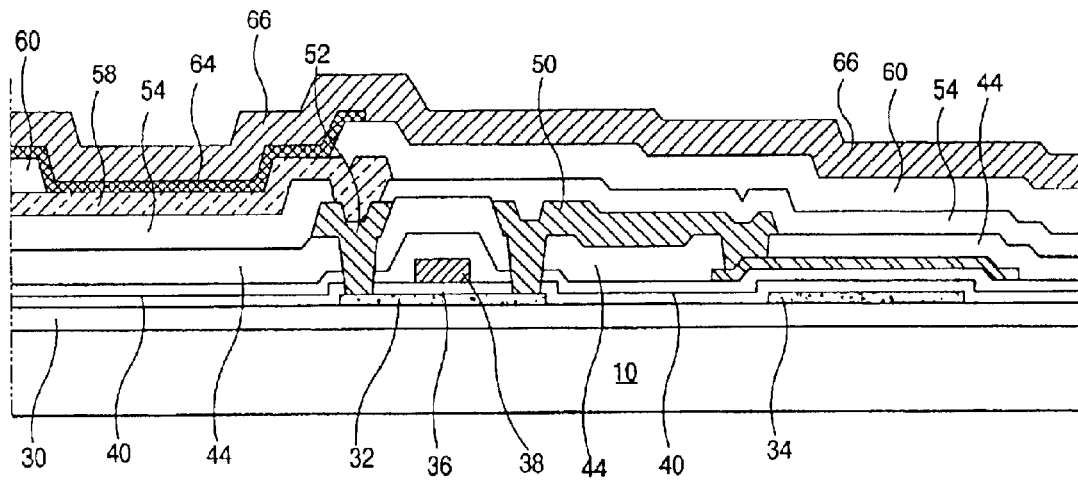

Since the anode 114 is formed on the first insulating layer 110 and the drain electrode 126 is connected to a top surface of the anode 114 in the active matrix organic EL device according to the present invention, a contact hole for connecting the drain electrode 126 and the anode 114 corresponding to the drain contact hole 56 (of FIG. 3F) may be simultaneously formed with first, second and storage contact holes. Accordingly, a process of forming the contact hole can be eliminated and the number of mask processes can be reduced.

FIGS. 5A to 5H are schematic cross-sectional views showing a fabricating process of an active matrix organic EL device of FIG. 4.

Figure 5A:
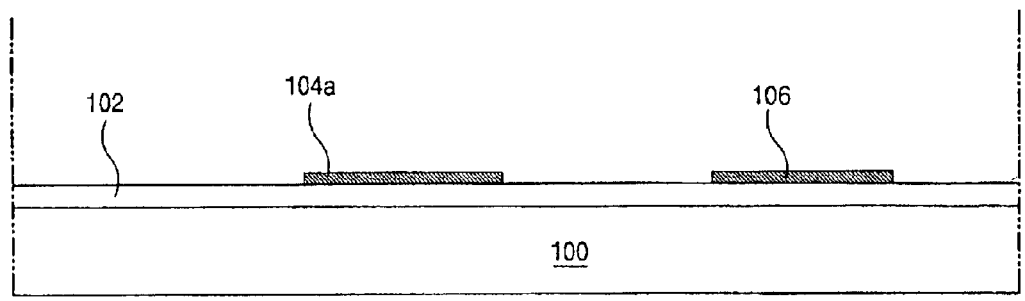
FIGS. 5A to 5H are schematic cross-sectional views showing a fabricating process of an active matrix organic EL device of FIG. 4.

In FIG. 5A, a buffer layer 102 is formed on a substrate 100. An active layer 104a and a storage electrode 106 of poly crystalline silicon are formed on the buffer layer 102 through a first mask process. The substrate 100 is one of a glass substrate, a plastic substrate and a flexible substrate. To form the active layer 104a of poly crystalline silicon, after amorphous silicon is deposited on the buffer layer 102, the amorphous silicon is dehydrogenated and crystallized through heat treatment. Moreover, the crystallization may be performed before or after the first mask process. The buffer layer 102 prevents the substrate 100 from being damaged during the crystallization. The buffer layer 102 is made of inorganic material such as silicon oxide ($SiO_2$) or silicon nitride (SiNx).

Figure 5B:
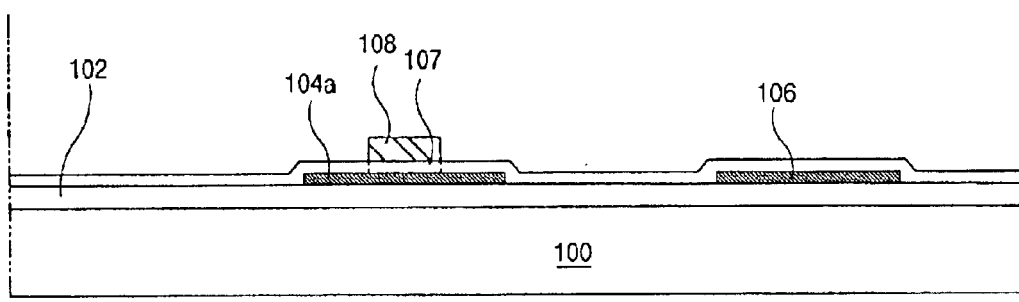

In FIG. 5B, after forming a gate insulating layer 107 on an entire surface of the substrate 100, a gate electrode 108 is formed on the gate insulating layer 107 through a second mask process. The gate insulating layer 107 is also made of inorganic material such as silicon oxide ($SiO_2$) or silicon nitride (SiNx). The gate electrode 108 may have a double layer structure, which includes a lower layer of aluminum (Al) or aluminum alloy and an upper layer of corrosion-resistant metal such as molybdenum (Mo), nickel (Ni) or tungsten (W). Preferably, a double layer of aluminum neodymium/molybdenum (AlNd/Mo) may be used as the gate electrode 108. A scanning line (not shown) including the gate electrode 108 is formed on the gate insulating layer 107.

Figure 5C:
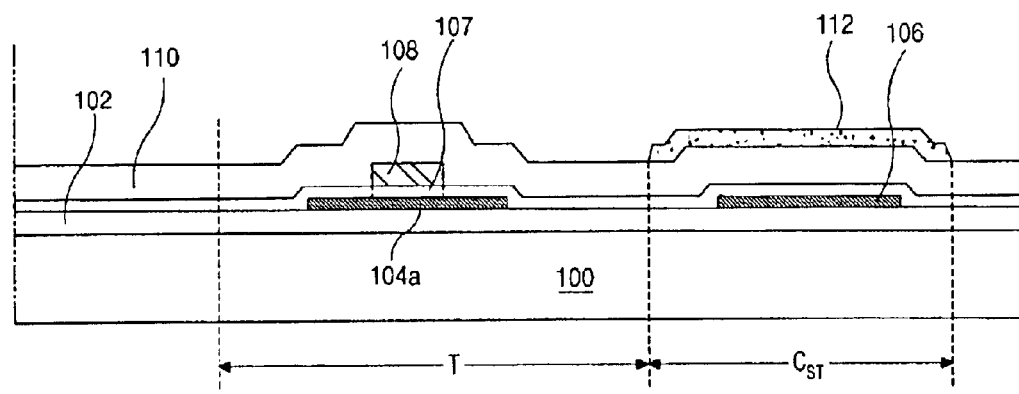

In FIG. 5C, after a first insulating layer 110 is formed on an entire surface of the substrate 100. A power electrode 112 covering the storage electrode 106 is formed on the first insulating layer 110 through a third mask process. The power electrode 112 and the storage electrode 106 constitute a storage capacitor "$C_{ST}$" with the first insulating layer 110 interposed therebetween. The first insulating layer 110 may be made of the same material as the gate insulating layer 107 or the buffer layer 102. e.g., $SiO_2$ or $SiN_x$. However, since the first insulating layer 110 is used for the storage capacitor "$C_{ST}$," a material of high permittivity is preferable for the first insulating layer 110. For example, silicon nitride ($SiN_x$) provides increased capacitance and enhanced ITO adhesion. The power electrode 112 may be made of low resistive metallic material, preferably Al alloy or double layer including lower Al alloy layer. A power line (not shown) including the power electrode 112 and crossing the scanning line is simultaneously formed on the first insulating layer 110.

Figure 5D:
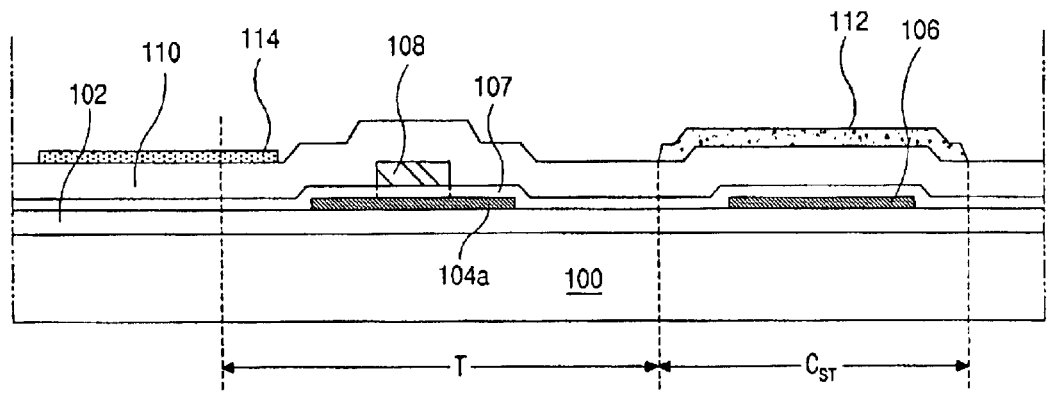

In FIG. 5D, an anode 114 is formed on the first insulating layer at a pixel region defined by the scanning line and the power line through a fourth mask process. Since light is emitted from an organic EL layer to the anode 114, the anode should transmit the emitted light. Accordingly, the anode 114 is made of transparent conductive material such as indium tin oxide (ITO).

Figure 5E:
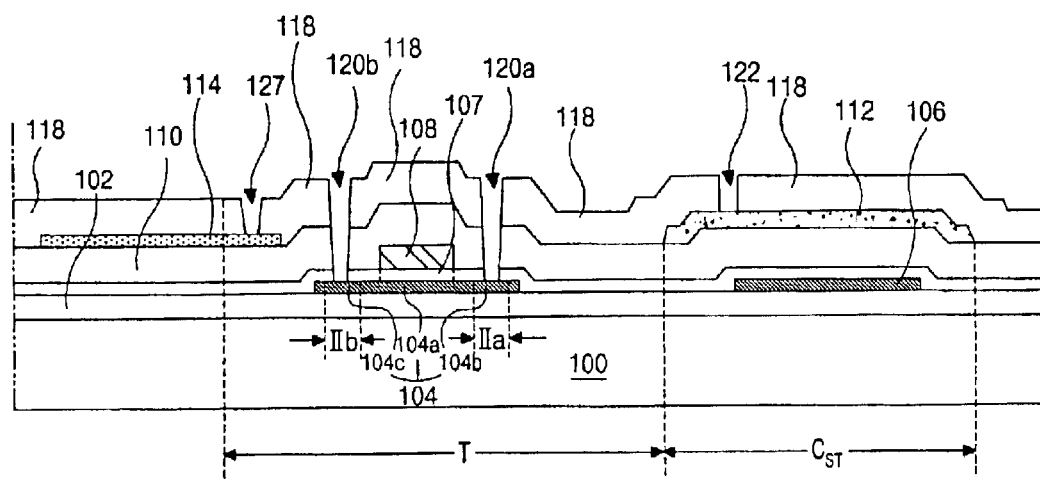

In FIG. 5E, a second insulating layer 118 having an anode contact hole 127, source and drain contact holes 120a and 120b and a storage contact hole 122 is formed on an entire surface of the substrate 100 through a fifth mask process. The anode contact hole 127, the storage contact hole 122, the source and drain contact holes 120a and 120b expose the anode 114, the power electrode 112, and right and left side portions of the active layer 104a, respectively. Next, ions are doped into the right and left side portions of the active layer 104a to form an ohmic contact layers 104b and 104c and to complete a semiconductor layer 104 having the active layer 104a and the ohmic contact layers 104b and 104c. The TFT may be n-type or p-type according to the kind of the ions. After the doping the ions, the ohmic contact layers 104b and 104c can be classified into source and drain regions "IIa" and "IIb."

Figure 5F:
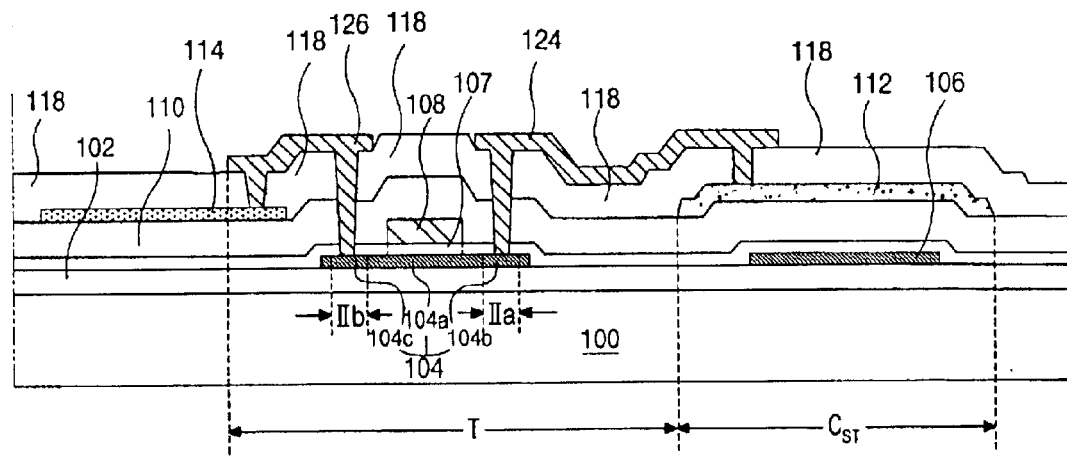

In FIG. 5F, source and drain electrodes 124 and 126 are formed on the second insulating layer 118 through a sixth mask process. The source electrode 124 is connected to the ohmic contact layer 104b of the source region "IIa" through the source contact hole 120a (of FIG. 5E) and to the power electrode 112 through the storage contact hole 122 (of FIG. 5E). The drain electrode 126 is connected to the ohmic contact layer 104b of the drain region "IIb" through the drain contact hole 120b (of FIG. 5E) and to the anode 114 through the anode contact hole 123. A signal line (not shown) including a source electrode of a switching TFT "$T_S$" (of FIG. 1) is also formed. The signal line is parallel to and spaced apart from the power line. The source and drain electrodes 124 and 126 are made of one of Mo, Ni or W. Or the source and drain electrodes 124 and 126 may have a double layer of AlNd/Mo. As a result, a TFT "T" having the semiconductor layer 104, the gate electrode 108, source and drain electrodes 124 and 126 is completed. Further, at least one other TFT may be formed through the process.

Figure 5G:
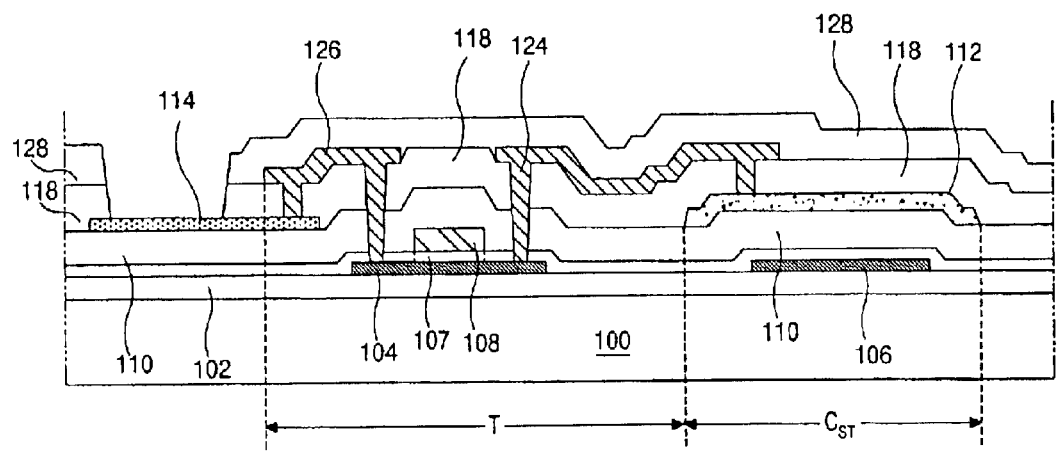

In FIG. 5G, a third insulating layer 128 having an open portion 130 is formed on an entire surface of the substrate 100 through a seventh mask process. The third insulating layer 128 protects and insulates the TFT "T" from an organic EL layer of next step. The third insulating layer 128 is made of an inorganic insulating material such as $SiO_2$ or SiNx.

Therefore, the number of the mask processes is reduced to seven in the active matrix organic EL device according to the present invention. Since the anode 114 is formed before forming the source and drain electrodes 124 and 126, the anode 114 can be connected to the drain electrode 126 through the anode contact hole 123 (of FIG. 5E) simultaneously formed with the storage contact hole 122 (of FIG. 5E), source and drain contact holes 120a and 120b (of FIG. 5E). Accordingly, a process for the drain contact hole 56 (of FIG. 3F) is omitted so that the number of the mask processes can be reduced.

Figure 5H:
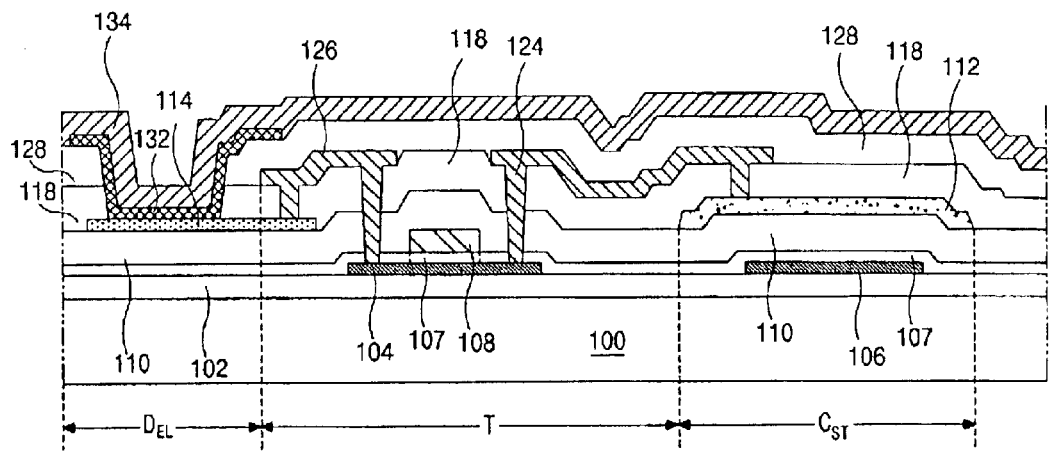

In FIG. 5H, an organic EL layer 132 connected to the anode 114 through the open portion 130 is formed on the third insulating layer 128. Then, a cathode 134 is formed on the organic EL layer 132. The cathode 134 is made of opaque metallic material whose work function is lower than about 4 eV, such as alkali metal, preferably, one of magnesium silver alloy (Mg:Ag), aluminum lithium alloy (Al:Li) and double layer of lithium fluoride/aluminum (LiF/Al). Since the organic material of the organic EL layer 132 is very susceptible to moisture, the mask process cannot be adopted after forming the organic EL layer 132. Therefore, the cathode 134 is formed without using the mask process.

In another embodiment, the number of the mask processes can be reduced to six by forming the power electrode and the anode through one mask process.

Figure 6:
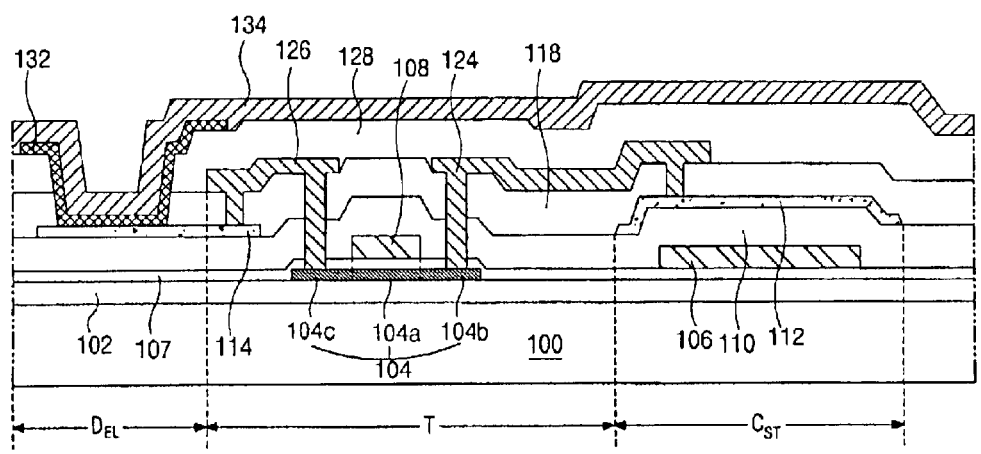
FIG. 6 is a schematic cross-sectional view of an active matrix organic EL device according to another exemplary embodiment of the present invention.

FIG. 6 is a schematic cross-sectional view of an active matrix organic EL device according to another exemplary embodiment of the present invention. Since the active matrix organic EL device uses a p-Si TFT, a top gate type is adopted. Even though a pixel structure of FIG. 1 is applied, other structures using one TFT or four TFTs can be applied. In the structure using one TFT, the TFT is disposed at a crossing of a scanning line and a signal line and an organic EL device is connected to the TFT. In the structure using four TFTs, TFTs for compensation are added to increase a brightness uniformity.

In FIG. 6, a buffer layer 102 is formed on a substrate 100. A semiconductor layer 104 is formed on the buffer layer 102. A gate insulating layer 107 and a gate electrode 108 are sequentially formed on a center portion of the semiconductor layer 104. A storage electrode 106 is the same layer as the gate electrode 108. Source and drain electrodes 124 and 126 are connected to right and left side portions of the semiconductor layer 104, respectively. A power electrode 112 covering the storage electrode 106 is connected to the source electrode 124 and a first insulating layer 110 is interposed between the power electrode 112 and the storage electrode 106 to constitute a storage capacitor "$C_{ST}$". Moreover, an anode 114 of an organic EL diode "$D_{EL}$" connected to the drain electrode 126 is the same layer as the power electrode 112. A second insulating layer 118 is formed over a TFT "T" and an organic EL layer 132 contacts the anode 114. A cathode 134 is formed on the organic EL layer 132 as a common electrode.

In a multi-layered structure of the organic EL diode "$D_{EL}$," the gate insulating layer 107 is formed on the buffer layer 102 and the first insulating layer 110 is formed on the gate insulating layer 107. The anode 114 is formed on the first insulating layer 110. The second and third insulating layers 118 and 128 commonly having an open portion are sequentially formed on the anode 114. The organic EL layer 132 and the cathode 134 are connected to the anode 114 through the open portion. The anode 114 is connected to the drain electrode 126 of the TFT "T" through an anode contact hole and the TFT "T" is insulated from the organic EL layer 132 by the third insulating layer 128. The anode 114 is made of transparent conductive material, preferably, indium tin oxide (ITO). The cathode 134 is made of aluminum (Al) or Al alloy of high reflectance. For the organic EL device of top emission type, the materials of the anode and the cathode may be exchanged. Further, the anode and the cathode may be changed according to the kind of the TFT.

The semiconductor layer 104 includes an active layer 104a and right and left side end portions 104b and 104c doped with impurities. The source electrode 124 is included by a power line (not shown) and the power electrode 112 is included by a redundant power line (not shown) corresponding to the power line.

Since the anode 114 is formed on the first insulating layer 110 and the drain electrode 126 is connected to a top surface of the anode 114 in the active matrix organic EL device according to the present invention, a contact hole for connecting the drain electrode 126 and the anode 114 corresponding to the drain contact hole 56 (of FIG. 3F) may be simultaneously formed with source, drain and storage contact holes. Accordingly, a process of forming the contact hole can be eliminated and the number of the mask processes can be reduced. Moreover, since the anode 114 and the power electrode 112 are simultaneously formed on the first insulating layer 110, the number of the mask processes can be reduced to six.

FIGS. 7A to 7G are schematic cross-sectional views showing a fabricating process of an active matrix organic EL device of FIG. 6.

Figure 7A:
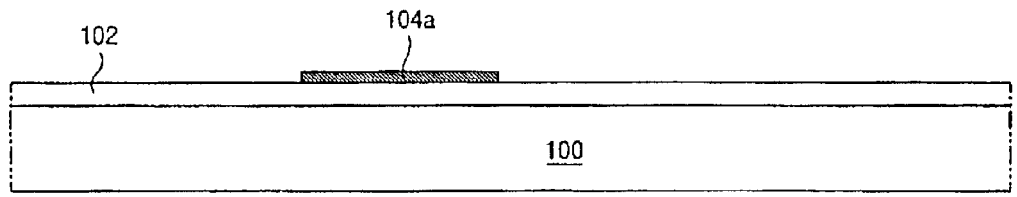
FIGS. 7A to 7G are schematic cross-sectional views showing a fabricating process of an active matrix organic EL device of FIG. 6.

In FIG. 7A, a buffer layer 102 is formed on a substrate 100. An active layer 104a of poly crystalline silicon is formed on the buffer layer 102 through a first mask process. The substrate 100 is one of a glass substrate, a plastic substrate and a flexible substrate. To form the active layer 104a of poly crystalline silicon, after amorphous silicon is deposited on the buffer layer 102, the amorphous silicon is dehydrogenated and crystallized through heat treatment. Moreover, the crystallization may be performed before or after the first mask process. The buffer layer 102 prevents the substrate 100 from being damaged during the crystallization. The buffer layer 102 is made of inorganic material such as silicon oxide ($SiO_2$) or silicon nitride (SiNx).

Figure 7B:
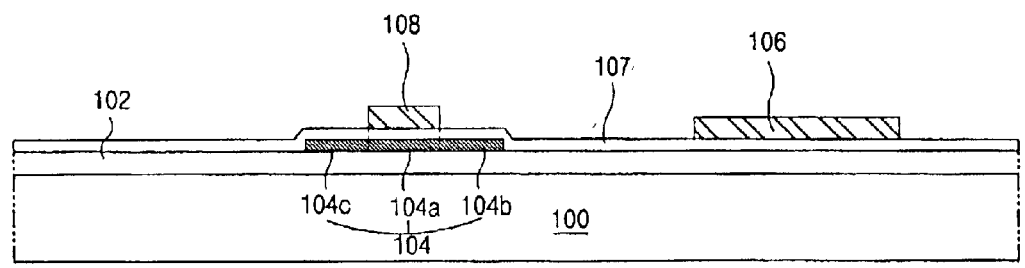

In FIG. 7B, after forming a gate insulating layer 107 on an entire surface of the substrate 100, a gate electrode 108 and a storage electrode 110 are formed on the gate insulating layer 107 through a second mask process. The gate insulating layer 107 is also made of inorganic material such as silicon oxide ($SiO_2$) or silicon nitride (SiNx). The gate electrode 108 may have a double layer structure, which includes a lower layer of aluminum (Al) or aluminum alloy and an upper layer of corrosion-resistant metal such as molybdenum (Mo), nickel (Ni) or tungsten (W). Preferably, a double layer of aluminum neodymium/molybdenum (AlNd/Mo) may be used as the gate electrode 108. A scanning line (not shown) including the gate electrode 108 is formed on the gate insulating layer 107. Further, the active layer 104a is doped with ions so that right and second side portions 104b and 104c become conductive. A semiconductor layer 104 including the right and second side portions 104b and 104c may be divided into n-type and p-type according to the kind of doped ions. For the p-type, the polarity of the anode and the cathode of the organic EL diode may be exchanged. Since the gate insulating layer 107 remains on an entire surface of the substrate 100, the gate electrode 108 and the storage electrode 110 can be formed through one mask process.

Figure 7C:
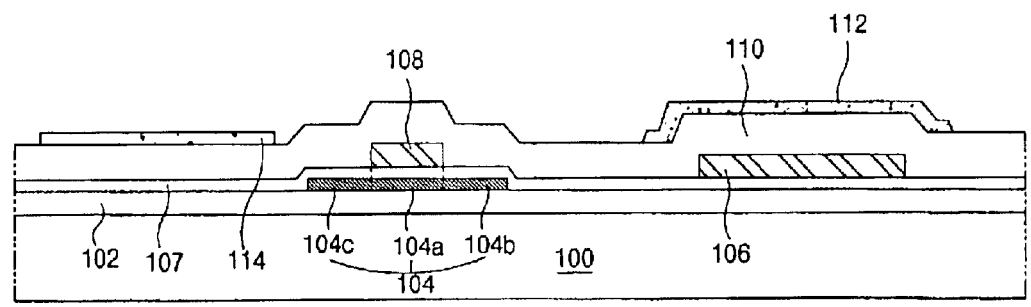

In FIG. 7C, after a first insulating layer 110 is formed on an entire surface of the substrate 100, a power electrode 112 covering the storage electrode 106 and an anode 114 are formed on the first insulating layer 110 through a third mask process. The power electrode 112 and the storage electrode 106 constitute a storage capacitor "$C_{ST}$" with the first insulating layer 110 interposed therebetween. The first insulating layer 110 may be made of the same material as the gate insulating layer 107 or the buffer layer 102, e.g. $SiO_2$ or $SiN_x$. However, since the first insulating layer 110 is used for the storage capacitor "$C_{ST}$," a material of high permittivity is preferable for the first insulating layer 110. For example, silicon nitride ($SiN_x$) provides increased capacitance and enhanced ITO adhesion. Moreover, since light is emitted from an organic EL layer to the anode 114, the anode should transmit the emitted light and be made of transparent conductive material such as indium tin oxide (ITO). Accordingly, the power electrode 112 is also made of transparent conductive material. Even though the anode and the power electrode are formed through individual mask processes in the conventional organic EL device, the anode and the power electrode are formed through one mask process in the present invention so that the number of the mask processes can be reduced.

Figure 7D:
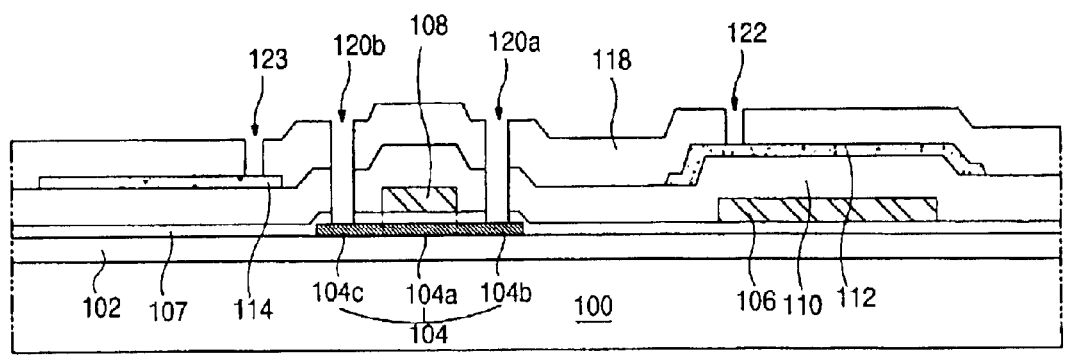

In FIG. 7D, a second insulating layer 118 having an anode contact hole 123, a storage contact hole 122, source and drain contact holes 120a and 120b is formed on an entire surface of the substrate 100 through a fourth mask process. The anode contact hole 123, and the storage contact hole 122, the source and drain contact holes 120a and 120b expose the anode 114, the power electrode 112, and right and left side portions of the active layer 104a, respectively. Since the anode contact hole 123, and the storage contact hole 122, and the source and drain contact holes 120a and 120b are simultaneously formed through one mask process, the number of the mask processes can be reduced. Further, wet and dry etching methods can be used to increase the contact property.

Figure 7E:
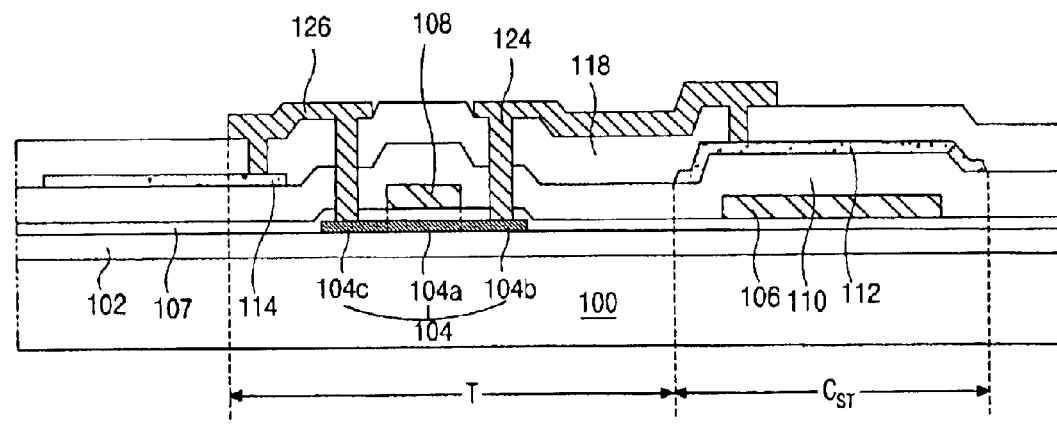

In FIG. 7E, source and drain electrode 124 and 126 are formed on the second insulating layer 118 through a fifth mask process. The source electrode 124 is connected to the ohmic contact layer 104b of the source region through the source contact hole 120a (of FIG. 7D) and to the power electrode 112 through the storage contact hole 122 (of FIG. 7D). The drain electrode 126 is connected to the ohmic contact layer 104c of the drain region through the drain contact hole 120b (of FIG. 7D) and to the anode 114 through the anode contact hole 123. A power line (not shown) includes the source electrode 124. A redundant power line (not shown) corresponding to the power line includes the power electrode 112. The signal line is parallel to and spaced apart from the power line. The source and drain electrodes 124 and 126 are made of one of Mo, Ni, W and a double layer of AlNd/Mo. As a result, a TFT "T" having the semiconductor layer 104, the gate electrode 108, and source and drain electrodes 124 and 126 is completed.

Figure 7F:
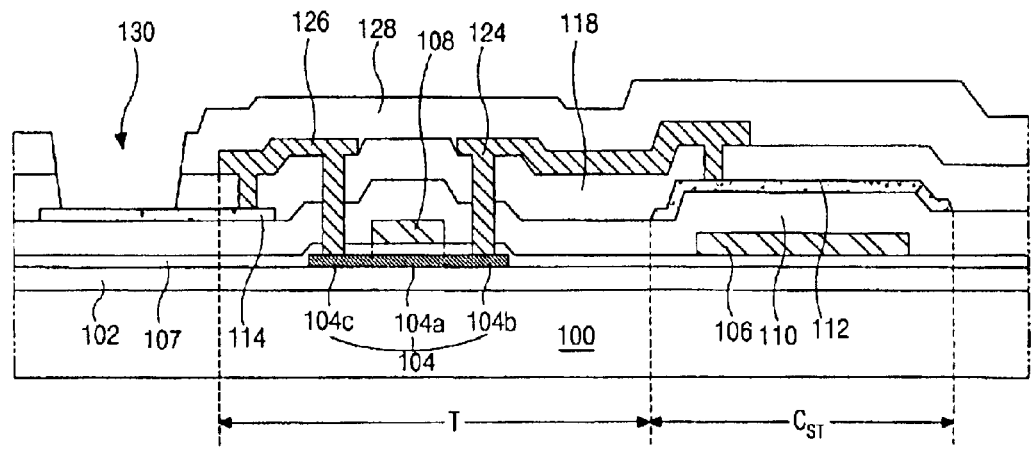

In FIG. 7F, a third insulating layer 128 having an open portion 130 is formed on an entire surface of the substrate 100 through a sixth mask process. The third insulating layer 128 protects and insulates the TFT "T" from an organic EL layer of next step. The third insulating layer 128 is made of an inorganic insulating material such as $SiO_2$ or SiNx. The open portion 130 exposes the anode 114.

Therefore, the number of the mask processes is reduced to six in the active matrix organic EL device according to the present invention. Since the anode 114 is formed before forming the source and drain electrodes 124 and 126, the anode 114 can be connected to the drain electrode 126 through the anode contact hole 123 (of FIG. 7D) simultaneously formed with the storage contact hole 122 (of FIG.

7D), and source and drain contact holes 120a and 120b (of FIG. 7D). Accordingly, a process for the drain contact hole 56 (of FIG. 3F) is omitted so that the number of the mask processes can be reduced. Moreover, since the anode 114 and the power electrode 112 are simultaneously formed through one mask process, the number of the mask processes can be reduced to six.

Figure 7G:
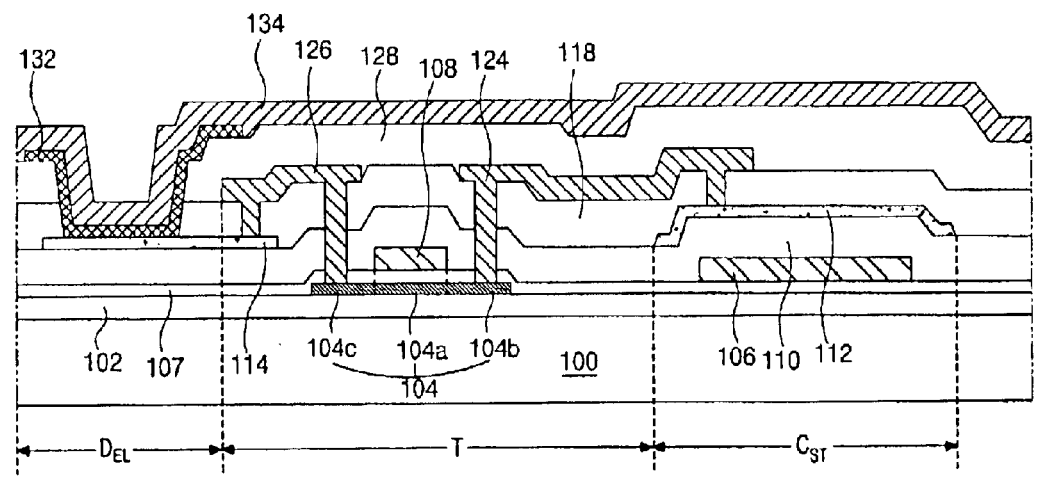

In FIG. 7G, an organic EL layer 132 connected to the anode 114 through the open portion 130 is formed on the third insulating layer 128. Then, a cathode 134 is formed on the organic EL layer 132. The cathode 134 is made of opaque metallic material whose work function is lower than about 4 eV, such as alkali metal, preferably, one of magnesium silver alloy (Mg:Ag), aluminum lithium alloy (Al:Li) and double layer of lithium fluoride/aluminum (LiF/Al). Since the organic material of the organic EL layer 132 is very susceptible to moisture, the mask process cannot be adopted after forming the organic EL layer 132. Therefore, the cathode 134 is formed without using a mask process.

Consequently, since the number of the mask processes is reduced, the fabrication cost and the process time are also reduced. Therefore, an active matrix organic EL device of improved production yield can be provided. Moreover, since a redundant power line is formed without increasing the number of mask processes, the possibility of inferior goods resulting from power line open is reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An active matrix organic electroluminescent device, comprising:
   a substrate;
   a semiconductor layer and a storage electrode on the substrate;
   a gate insulating layer on the semiconductor layer and the storage electrode, the gate insulating layer having source and drain contact holes;
   a gate electrode on the gate insulating layer over the semiconductor layer;
   a first insulating layer on the gate electrode, the first insulating layer covering the storage electrode and having source and drain contact holes in common with the gate insulating layer;
   a power electrode on the first insulating layer over the storage electrode;
   a first electrode on the first insulating layer;
   a second insulating layer on the first electrode, the second insulating layer having an open portion, an electrode contact hole and a storage contact hole, the second insulating layer having source and drain contact holes in common with the gate insulating layer and the first insulating layer;
   source and drain electrodes on the second insulating layer spaced apart from each other, the source electrode being connected to the semiconductor layer through the source contact hole and to the power electrode through the storage contact hole, the drain electrode being connected to the semiconductor layer through the drain contact hole and to the first electrode through the electrode contact hole;
   a third insulating layer on the source and drain electrodes, the third insulating layer having the open portion in common with the second insulating layer;
   an organic electroluminescent layer on the third insulating layer, the organic electroluminescent layer contacting the first electrode through the open portion; and
   a second electrode on the organic electroluminescent layer.

2. The device according to claim 1, wherein the first, second and third insulating layers are made of inorganic insulating material.

3. The device according to claim 2, wherein the inorganic insulating material is one of silicon oxide ($SiO_2$) and silicon nitride (SiNx).

4. The device according to claim 1, wherein the semiconductor layer and the storage electrode are simultaneously formed.

5. The device according to claim 1, wherein the semiconductor layer and the storage electrode are in the same layer.

6. The device according to claim 1, wherein side end portions of the semiconductor layer are doped with ions.

7. The device according to claim 1, wherein the first electrode is made of transparent conductive material.

8. The device of claim 7, wherein the transparent conductive material is indium tin oxide (ITO).

9. The device according to claim 1, wherein the second electrode is made of an opaque conductive material having a work function of lower than about 4 eV.

10. The device according to claim 9, wherein the opaque conductive material is alkali metal.

11. The device according to claim 9, wherein the opaque conductive material is one of magnesium/silver (Mg:Ag) alloy, aluminum/lithium (Al:Li) alloy and double layer of lithium fluoride (LiF) and aluminum (Al).

12. The device according to claim 1, further comprising a scanning line along a first direction, and a signal line and a power line along a second direction, the scanning line including the gate electrode, the signal line including the source electrode, the power line including the power electrode and being spaced apart from the signal line.

13. The device according to claim 1, wherein the organic electroluminescent layer has a hole-injection layer, a hole-transport layer, an emission layer and an electron-transport layer.

14. The device according to claim 1, wherein the organic electroluminescent layer is formed through a vacuum evaporation method.

15. The device according to claim 1, wherein the semiconductor layer is made of poly crystalline silicon.

16. A fabricating method of an active matrix organic electroluminescent device, comprising:
    forming a semiconductor layer and a storage electrode on a substrate;
    forming a gate insulating layer on the semiconductor layer and the storage electrode, the gate insulating layer having source and drain contact holes;
    forming a gate electrode on the gate insulating layer over the semiconductor layer;
    forming a first insulating layer on the gate electrode, the first insulating layer covering the storage electrode and having source and drain contact holes in common with the gate insulating layer;
    forming a power electrode on the first insulating layer over the storage electrode;
    forming a first electrode on the first insulating layer;
    forming a second insulating layer on the first electrode, the second insulating layer having an open portion, an electrode contact hole and a storage contact hole, the second insulating layer having source and drain contact holes in common with the gate insulating layer and the first insulating layer;

forming source and drain electrodes on the second insulating layer spaced apart from each other, the source electrode being connected to the semiconductor layer through the source contact hole and to the power electrode through the storage contact hole, the drain electrode being connected to the semiconductor layer through the drain contact hole and to the first electrode through the electrode contact hole;

forming a third insulating layer on the source and drain electrodes, the third insulating layer having the open portion in common with the second insulating layer;

forming an organic electroluminescent layer on the third insulating layer, the organic electroluminescent layer contacting the first electrode through the open portion; and forming a second electrode on the organic electroluminescent layer.

17. The method according to claim 16, wherein the anode contact hole, the storage contact hole, the source and drain contact holes are simultaneously formed.

18. The method according to claim 16, wherein the semiconductor layer and the storage electrode are simultaneously formed.

19. The method according to claim 16, wherein the first, second and third insulating layers are made of inorganic insulating material.

20. The method according to claim 16, further comprising doping ions into end portions of the semiconductor layer.

21. The method according to claim 16, wherein the first electrode is made of a transparent conductive material.

22. The method according to claim 21, wherein the transparent conductive material is indium tin oxide (ITO).

23. The method according to claim 16, wherein the second electrode is formed of an opaque conductive material having a work function of lower than about 4 eV.

24. The method according to claim 16, further comprising forming a scanning line along a first direction, and a signal line and a power line along a second direction, the scanning line including the gate electrode, the signal line including the source electrode, the power line including the power electrode and being spaced apart from the signal line.

25. The method according to claim 16, wherein the organic electroluminescent layer has a hole-injection layer, a hole-transport layer, an emission layer and an electron-transport layer.

26. The method according to claim 16, wherein the organic electroluminescent layer is formed through a vacuum evaporation method.

27. The method according to claim 16, wherein the semiconductor layer is made of poly crystalline silicon.

28. An active matrix organic electroluminescent device, comprising:

a substrate;

a semiconductor layer on the substrate;

a gate insulating layer on the semiconductor layer, the gate insulating layer having source and drain contact holes;

a gate electrode and a storage electrode on the gate insulating layer, the gate electrode being over the semiconductor layer;

a first insulating layer on the gate electrode and the storage electrode, the first insulating layer having source and drain contact holes in common with the gate insulating layer;

a power electrode and a first electrode on the first insulating layer, the power electrode over the storage electrode;

a second insulating layer on the power electrode and the first electrode, the second insulating layer having an open portion, an electrode contact hole and a storage contact hole, the second insulating layer having the source and drain contact holes in common with the gate insulating layer and the first insulating layer;

source and drain electrodes on the second insulating layer spaced apart from each other, the source electrode being connected to the semiconductor layer through the source contact hole and to the power electrode through the storage contact hole, the drain electrode being connected to the semiconductor layer through the drain contact hole and to the first electrode through the electrode contact hole;

a third insulating layer on the source and drain electrodes, the third insulating layer having the open portion in common with the second insulating layer;

an organic electroluminescent layer on the third insulating layer, the organic electroluminescent layer contacting the first electrode through the open portion; and a second electrode on the organic electroluminescent layer.

29. The device according to claim 28, wherein the semiconductor layer is made of poly crystalline silicon.

30. The device according to claim 28, wherein the gate electrode and the storage electrode are simultaneously formed.

31. The device according to claim 28, wherein the power electrode and the first electrode are simultaneously formed.

32. The device according to claim 28, wherein the first electrode is made of transparent conductive material.

33. The device according to claim 28, wherein the active matrix organic electroluminescent device is a bottom emission type.

34. The device according to claim 32, wherein the transparent conductive material is indium tin oxide (ITO).

35. The device according to claim 28, wherein the second electrode is made of transparent conductive material.

36. The device according to claim 28, wherein the active matrix organic electroluminescent device is a top emission type.

37. The device according to claim 28, wherein the gate insulating layer is formed on an entire surface of the substrate.

38. The device according to claim 28, further comprising a scanning line along a first direction, and a signal line and a power line along a second direction, the scanning line including the gate electrode, the signal line including the source electrode, the power line including the power electrode and being spaced apart from the signal line.

39. A fabricating method of an active matrix organic electroluminescent device, comprising:

forming a semiconductor layer on a substrate through a first mask process;

forming a gate insulating layer on the semiconductor layer;

simultaneously forming a gate electrode and a storage electrode on the gate insulating layer through a second mask process, the gate electrode being over the semiconductor layer;

doping ions into the semiconductor layer;

forming a first insulating layer on the gate electrode and the storage electrode;

simultaneously forming a power electrode and a first electrode on the first insulating layer through a third insulating layer, the power electrode covering the storage electrode;

forming a second insulating layer on the power electrode and the first electrode;

simultaneously forming an electrode contact hole, storage contact hole, source and drain contact holes of the second insulating layer through a four mask process, the anode contact hole exposing the first electrode, the storage contact hole exposing the power electrode, the source and drain electrodes exposing the semiconductor layer;

forming source and drain electrodes spaced apart from each other on the second insulating layer through a fifth mask process, the source electrode being connected to the semiconductor layer through the source contact hole and to the power electrode through the storage contact hole, the drain electrode being connected to the semiconductor through the drain contact hole and to the first electrode through the electrode contact hole;

forming the third insulating layer on the source and drain electrodes;

forming an open portion of the third insulating layer through a sixth mask process, the open portion exposing the first electrode;

forming an organic electroluminescent layer on the third insulating layer, the organic electroluminescent layer contacting the first electrode through the open portion; and forming a second electrode on the organic electroluminescent layer.

40. The method according to claim 39, wherein the semiconductor layer is made of poly crystalline silicon.

41. The method according to claim 39, wherein the source and drain contact holes are formed through sequentially etching the gate insulating layer, the first and second insulating layers.

42. The method according to claim 39, wherein the source and drain contact holes are formed by simultaneously etching the second insulating layer, the first insulating layer and the gate insulating layer.

43. The method according to claim 39, wherein the storage and electrode contact holes are formed by simultaneously etching the second insulating layer.

44. The method according to claim 39, further comprising forming a redundant power line including the power electrode, and forming a power line including the source electrode corresponding to the redundant power line.

* * * * *